(12) United States Patent
Nakamura et al.

(10) Patent No.: US 7,075,866 B2
(45) Date of Patent: Jul. 11, 2006

(54) CLOCK EXTRACTING DEVICE OF A DISC REPRODUCING APPARATUS HAVING A GAIN COMMAND UNIT FOR DESIGNATING A LOOP GAIN

(75) Inventors: Masayoshi Nakamura, Hirakata (JP); Emi Kitano, Shiki-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 571 days.

(21) Appl. No.: 09/986,671

(22) Filed: Nov. 9, 2001

(65) Prior Publication Data
US 2002/0057633 A1 May 16, 2002

(30) Foreign Application Priority Data
Nov. 16, 2000 (JP) ............................ P2000-349346

(51) Int. Cl.
*G11B 5/09* (2006.01)
*G11B 7/005* (2006.01)
(52) U.S. Cl. ................................. 369/47.25; 369/47.28
(58) Field of Classification Search ............ 369/47.25, 369/47.28; G11B 5/09, 7/005
See application file for complete search history.

(56) References Cited

U.S. PATENT DOCUMENTS

| | | | | |
|---|---|---|---|---|
| 5,086,421 A | * | 2/1992 | Tateishi | ................... 369/47.28 |
| 5,526,339 A | * | 6/1996 | Shimada | ................... 369/59.19 |
| 5,604,771 A | | 2/1997 | Quiros | |
| 5,636,196 A | | 6/1997 | Kumagai | |
| 5,959,954 A | | 9/1999 | Yamamuro | |
| 5,982,724 A | * | 11/1999 | Hayashi et al. | ............ 369/47.3 |
| 6,088,311 A | | 7/2000 | Katoh | |
| 6,134,197 A | * | 10/2000 | Ishibashi et al. | ......... 369/44.32 |
| 6,175,542 B1 | * | 1/2001 | Okada et al. | ............ 369/59.17 |
| 6,205,095 B1 | * | 3/2001 | Hisakado et al. | ........ 369/47.25 |

FOREIGN PATENT DOCUMENTS

| | | |
|---|---|---|
| DE | 693 25 685 | 6/2000 |
| EP | 0 585 090 | 7/1999 |

* cited by examiner

*Primary Examiner*—A M Psitos
(74) *Attorney, Agent, or Firm*—Wenderoth, Lind & Ponack, L.L.P.

(57) ABSTRACT

A clock extracting device of a disc reproducing apparatus includes an information read-out member for reading information signals from a disklike information recording medium; a voltage control oscillator; a phase comparator; a frequency comparator; a speed sensor for detecting the frequency of the output of the voltage control oscillator at a reference clock so as to output a speed signal; a gain command unit for designating a loop gain of a clock extracting circuit in accordance with the speed signal outputted from the speed sensor; a charge pump which discharges or draws electric current in accordance with outputs of the phase comparator and the frequency comparator and changes over an output current value in accordance with a gain command of the gain command unit; and a series circuit of a resistor and a capacitor, wherein the gain command unit issues the gain command such that the loop gain of the clock extracting circuit secures a desired operating point in accordance with a read rate of the information signals.

10 Claims, 11 Drawing Sheets

CLOCK EXTRACTING DEVICE OF A DISC REPRODUCING APPARATUS HAVING A GAIN COMMAND UNIT FOR DESIGNATING A LOOP GAIN

BACKGROUND OF THE INVENTION

1. Field of the Invention

The present invention relates to a clock extracting device for extracting a clock synchronous in phase with information signals read from a disklike information recording medium (hereinafter, referred to as a "disc"), which is employed in a disc reproducing apparatus for recording the information signals at the extracted clock.

2. Description of the Prior Art

A constant linear velocity (CLV) recording method is known as one of the methods for recording information signals on a disc. In order to read from the disc the information signals subjected to CLV recording, it is necessary to provide a clock extracting circuit for extracting a clock synchronous in phase with the information signals.

A conventional clock extracting circuit is described with reference to FIG. 11 showing a first example of a clock extracting device of a conventional optical disc reproducing apparatus. In FIG. 11, information signals fetched from an optical disc 1 by an optical pickup 2 are inputted to one input terminal of a phase comparator 3 and one input terminal of a frequency comparator 8. Outputs of the phase comparator 3 and the frequency comparator 8 control a charge pump 4 and an output of the charge pump 4 is not only applied to a series circuit of a resistor R1 and a capacitor C1 but inputted to a voltage control oscillator 5. A portion of an output PCK of the voltage control oscillator 5 is applied to the other input terminal of the phase comparator 3 and the other input terminal of the frequency comparator 8.

The frequency comparator 8 compares a clock frequency to be extracted from the information signals and a frequency of the output PCK of the voltage control oscillator 5 so as to yield a frequency comparison output. The charge pump 4 is operated in accordance with the frequency comparison output of the frequency comparator 8 and the voltage control oscillator 5 is operated under control of a control voltage produced by the series circuit of the resistor R1 and the capacitor C1 such that the frequency of the output PCK of the voltage control oscillator 5 is made coincident with the clock frequency to be extracted from the information signals. When the frequency of the output PCK of the voltage control oscillator 5 has been made coincident with the clock frequency to be extracted from the information signals, output of the frequency comparator 8 is stopped and the phase comparator 3 is operated so as to make a phase of the information signals coincident with a phase of the output PCK of the voltage control oscillator 5.

Operation of the phase comparator 3 is described hereinafter on the supposition that "θREF" denotes the phase of the information signals, "θOSC" denotes the phase of the output PCK of the voltage control oscillator 5, "Kφ" (A/rad) denotes a phase-current conversion gain of a combination of the phase comparator 3 and the charge pump 4, "KV" (Hz/V) denotes a voltage-frequency conversion gain of the voltage control oscillator 5, "I" denotes an output current flowing through the charge pump 4 under control of the phase comparator 3, "F" denotes a transfer function of the series circuit of the resistor R1 and the capacitor C1, "j" and "ω" denote an imaginary unit and an angular frequency in Fourier transform, respectively and "s" satisfies a relation of (jω=s).

At this time, the phase comparator 3 compares the phase of the information signals read from the optical disc 1 by the optical pickup 2 and the phase of the output PCK of the voltage control oscillator 5 and outputs the current I corresponding to the phase difference as follows.

$$(\theta REF - \theta OSC)K\phi = I \quad (1)$$

Then, the output of the charge pump 4 is converted into a voltage V as follows by the series circuit of the resistor R1 and the capacitor C1, whose one end is connected to the output of the charge pump 4 and the other end of which is grounded or is connected to a reference voltage.

$$I \times F = V \quad (2)$$

Supposing that the resistor R1 has a resistance R and the capacitor C1 has a capacity C, the transfer function F of the series circuit of the resistor R1 and the capacitor C1 is expressed as follows.

$$F = R + 1/(s \times C) \quad (3)$$

Meanwhile, the frequency of the output PCK of the voltage control oscillator 5 is changed by using an output of the series circuit as the control voltage such that the following relation is established.

$$s \times \theta OSC = KV \times V \quad (4)$$

By substituting I of the equation (2) and V of the equation (4) for the equation (1), the following equation is obtained.

$$(\theta REF - \theta OSC)K\phi = s \times \theta OSC/(KV \times F)$$

Then, this equation is changed as follows.

$$\theta OSC/\theta REF = G/(1+G) \quad (5)$$

In the equation (5), "G" satisfies the following relation.

$$G = K\phi \times KV \times F/s \quad (6)$$

The equation (5) represents open loop characteristics of this conventional clock extracting circuit. It will be understood from the equation (6) that a loop gain of this conventional clock extracting circuit is proportional to a product of the gain of the phase comparator 3 and the gain of the voltage control oscillator 5.

As a read rate of the information signals is raised further, fluctuations of jitter become larger. Thus, a necessary loop gain of the clock extracting circuit becomes large in accordance with a magnitude of the error. For example, in the CLV recording method, the number of revolutions at an inner periphery of the optical disc 1 is different from that at an outer periphery of the optical disc 1 in order to secure a constant linear velocity. Therefore, when the optical pickup 2 is displaced through a large distance from the inner periphery to the outer periphery of the optical disc 1, a linear velocity at the outer periphery of the optical disc 1 becomes higher than that at the inner periphery of the optical disc 1, so that the read rate is also raised accordingly and thus, the necessary loop gain of the clock extracting circuit also changes greatly. This phenomenon becomes more conspicuous as the read rate of the information signals rises further. Therefore, the necessary loop gain of the clock extracting circuit changes according to the read rate of the information signals. Accordingly, in order to ensure stable reproduction of the information signals from the inner periphery to the outer periphery of the optical disc 1, it is necessary to change the loop gain of the clock extracting circuit in accordance with the read rate of the information signals.

A method of changing over a loop gain of a known clock extracting circuit is described with reference to FIG. 12 showing a second example of the clock extracting device of the known optical disc reproducing apparatus. FIG. 12 is different from FIG. 11 in that an output of the voltage control oscillator 5 is connected to one input of a changeover switch 33 and is also connected to the other input of the changeover switch 33 via a frequency divider 31 for performing frequency division of the output of the voltage control oscillator 5 to a half and a speed setter 32 is provided for effecting changeover of the changeover switch 33.

In accordance with an output of the speed setter 32, the changeover switch 33 is changed over to one of a state in which the changeover switch 33 is directly connected to the voltage control oscillator 5 and a state in which the changeover switch 33 is connected to the voltage control oscillator 5 through the frequency divider 31. Namely, when the output of the speed setter 32 is of 1-time speed, the changeover switch 33 is connected to the frequency divider 31. On the other hand, when the output of the speed setter 32 is of 2-time speed, the changeover switch 33 is directly connected to the output of the voltage control oscillator 5.

As described above, conventionally, the changeover switch 33 is changed over in accordance with speed set by the speed setter 32 so as to change a voltage-frequency conversion gain of the voltage control oscillator 5 such that changeover of the loop gain of the clock extracting circuit is effected.

However, even if actual read rate of the information signals changes greatly as in the case where the optical pickup 2 is displaced through a large distance from the inner periphery to the outer periphery of the optical disc 1, the loop gain of the prior art clock extracting circuit is determined by the preset speed and thus, operation of the prior art clock extracting circuit becomes unstable when the set speed is not coincident with the actual read rate. For example, in case the actual read rate of the information signals is lower than the set speed, the loop gain rises due to frequency pulling upon operation of the frequency comparator 8, so that in the worst case, oscillation leads to a state in which the clock frequency to be extracted from the information signals does not become coincident with the frequency of the output of the voltage control oscillator 5. Meanwhile, even when the clock frequency to be extracted from the information signals is coincident with the frequency of the output of the voltage control oscillator 5, rise of the loop gain due to phase lock upon operation of the phase comparator 3 may lead, in the worst case, to a state in which it is impossible to extract the clock by oscillation.

Thus, in the clock extracting device of the prior art disc reproducing apparatus, such a disadvantage is incurred that although it is necessary to change the loop gain of the clock extracting circuit in accordance with the continuously changing read rate of the information signals, the loop gain of the clock extracting circuit is changed only when the read rate of the information signals has been set.

SUMMARY OF THE INVENTION

Accordingly, an essential object of the present invention is to provide, with a view to eliminating the above mentioned drawbacks of the prior art, a clock extracting device of a disc reproducing apparatus, which is capable of securing a desired operating point automatically even in case of a large change of read rate of information signals of a disc so as to ensure stable reproduction of the information signals from an inner periphery to an outer periphery of the disc.

In order to accomplish this object of the present invention, a clock extracting device of a disc reproducing apparatus, according to the present invention comprises: an information read-out means for reading information signals from a disklike information recording medium; a voltage control oscillator; a phase comparator for comparing a phase of the information signals read by the information read-out means and a phase of an output of the voltage control oscillator; a frequency comparator for comparing a frequency of the information signals read by the information read-out means and a frequency of the output of the voltage control oscillator; a speed sensor for detecting the frequency of the output of the voltage control oscillator at a reference clock so as to output a speed signal; a gain command unit for designating a loop gain of a clock extracting circuit in accordance with the speed signal outputted from the speed sensor; a charge pump which discharges or draws electric current in accordance with outputs of the phase comparator and the frequency comparator and changes over an output current value in accordance with a gain command of the gain command unit; and a series circuit of a resistor and a capacitor, whose one end is connected to an output of the charge pump and the other end of which is grounded or is connected to a reference voltage; wherein an output voltage between the opposite ends of the series circuit acts as a control voltage for the voltage control oscillator and the gain command unit issues the gain command such that the loop gain of the clock extracting circuit secures a desired operating point in accordance with a read rate of the information signals.

BRIEF DESCRIPTION OF THE DRAWINGS

This object and features of the present invention will become apparent from the following description taken in conjunction with the preferred embodiments thereof with reference to the accompanying drawings in which.

DETAILED DESCRIPTION OF THE INVENTION

Figure 1:
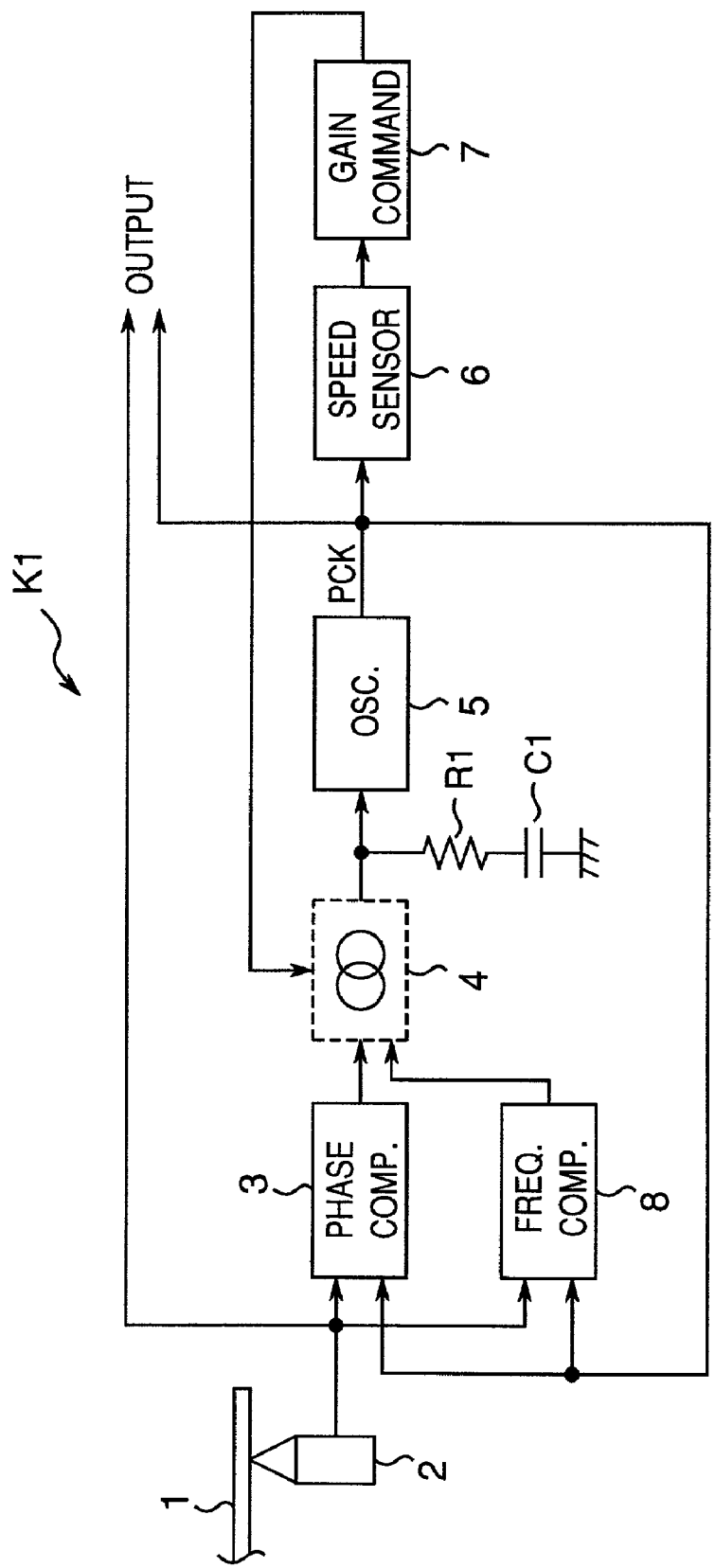
FIG. 1 is a block diagram of a clock extracting device of an optical disc reproducing apparatus, according to a first embodiment of the present invention.

Before the description of the present invention proceeds, it is to be noted that like parts are designated by like reference numerals throughout several views of the accompanying drawings.

Hereinafter, embodiments of the present invention are described with reference to drawings by using an optical disc as a recording medium.

FIRST EMBODIMENT

FIG. 1 shows a clock extracting device K1 of an optical disc reproducing apparatus, according to a first embodiment of the present invention. In FIG. 1, information signals fetched from a disklike information recording medium such as an optical disc 1 by an information read-out means such as an optical pickup 2 are inputted to one input terminal of a phase comparator 3 and one input terminal of a frequency comparator 8. Outputs of the phase comparator 3 and the frequency comparator 8 control a charge pump 4 as described later so as to be converted into a current value by the charge pump 4. This current value from the charge pump 4 is applied to a series circuit of a resistor R1 and a capacitor C1 so as to be converted into a voltage value by the series circuit. This voltage value acts as a control voltage for a voltage control oscillator 5 and is inputted to the voltage control oscillator 5.

In this embodiment, the other end of the capacitor C1 is grounded but may also be connected to a reference voltage source (not shown) as necessary. A portion of an output PCK of the voltage control oscillator 5 is applied to the other input terminal of the phase comparator 3 and the other input terminal of the frequency comparator 8 and is also inputted to a speed sensor 6. An output of the speed sensor 6 is inputted to a gain command unit 7 and an output of the gain command unit 7 is fed back to the charge pump 4.

The phase comparator 3 compares a phase of the information signals read from the optical disc 1 by the optical pickup 2 and a phase of the output PCK of the voltage control oscillator 5 so as to output a signal corresponding to the phase difference. Meanwhile, the frequency comparator 8 compares a frequency of the information signals read from the optical disc 1 by the optical pickup 2 and a frequency of the output PCK of the voltage control oscillator 5 so as to output a signal corresponding to the frequency difference. Namely, the frequency comparator 8 compares a clock frequency to be extracted from the information signals and the frequency of the output PCK of the voltage control oscillator 5 so as to yield a frequency comparison output. The charge pump 4 is operated in accordance with the frequency comparison output of the frequency comparator 8. The voltage control oscillator 5 is operated under control of the control voltage outputted by the series circuit of the resistor R1 and the capacitor C1 such that the frequency of the output PCK of the voltage control oscillator 5 is coincident with the clock frequency to be extracted from the information signals. When the frequency of the output PCK of the voltage control oscillator 5 has been made coincident with the clock frequency to be extracted from the information signals, output of the frequency comparator 8 is stopped and the phase comparator 3 is operated so as to make the phase of the information signals coincident with the phase of the output PCK of the voltage control oscillator 5.

Figure 2:
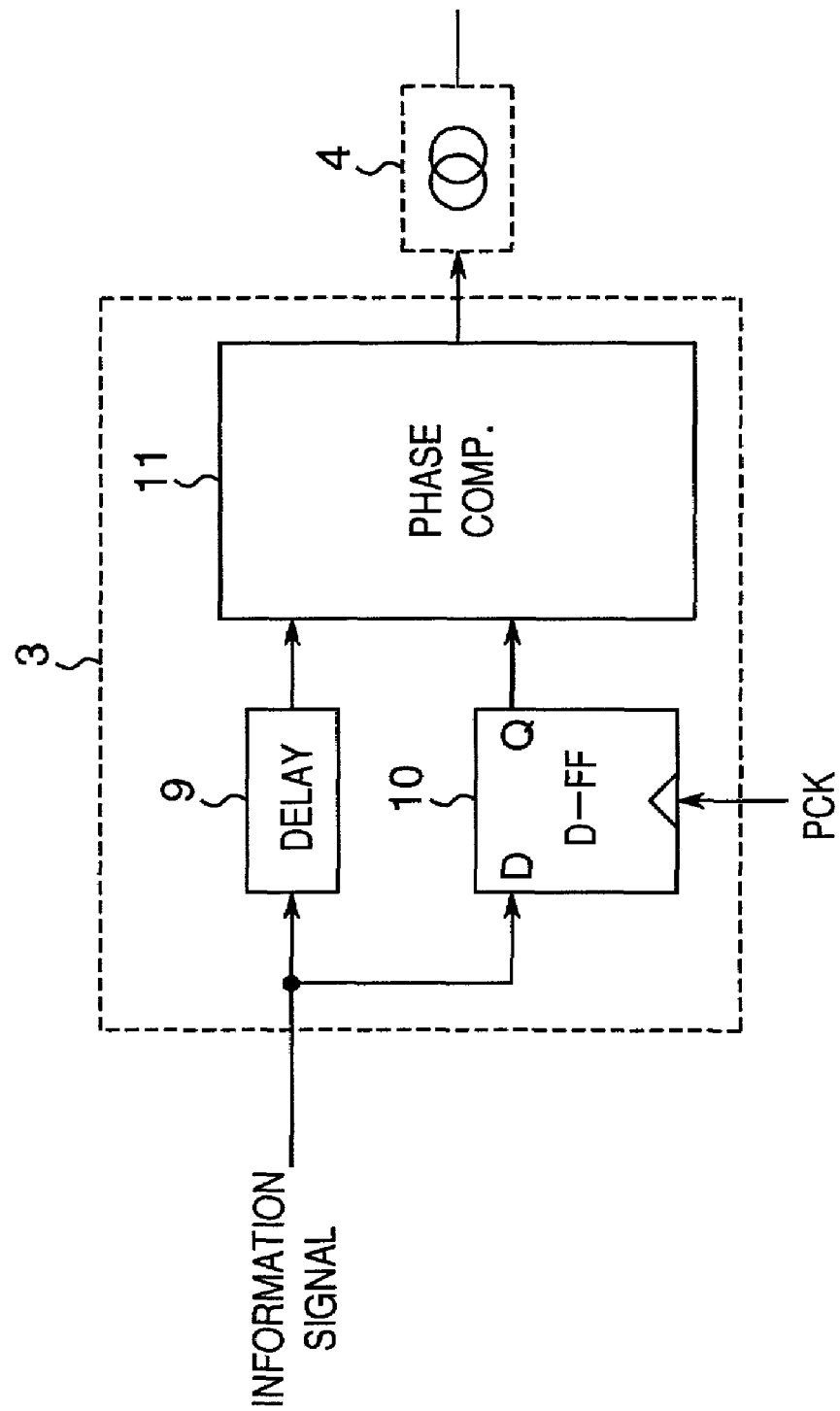
FIG. 2 is a block diagram of a phase comparator employed in the clock extracting device of FIG. 1.

The phase comparator 3 is described in more detail with reference to FIG. 2. In FIG. 2, the inputted information signals are applied to a delay device 9 and a D terminal of a D flip-flop 10. An output of the delay device 9 is inputted to one terminal of a phase comparison unit 11, while an output from a Q terminal of the D flip-flop 10 is inputted to the other terminal of the phase comparison unit 11. The output PCK of the voltage control oscillator 5 is inputted to a clock terminal of the D flip-flop 10. The D flip-flop 10 detects and outputs a rise edge of the information signals by using the output PCK of the voltage control oscillator 5 as a reference clock. The phase comparison unit 11 compares a phase of the information signals delayed by the delay device 9 and a phase of the output of the D flip-flop 10. Thus, phase comparison is performed only when the rise edge of the information signals has been detected by the D flip-flop 10.

Figure 3A:
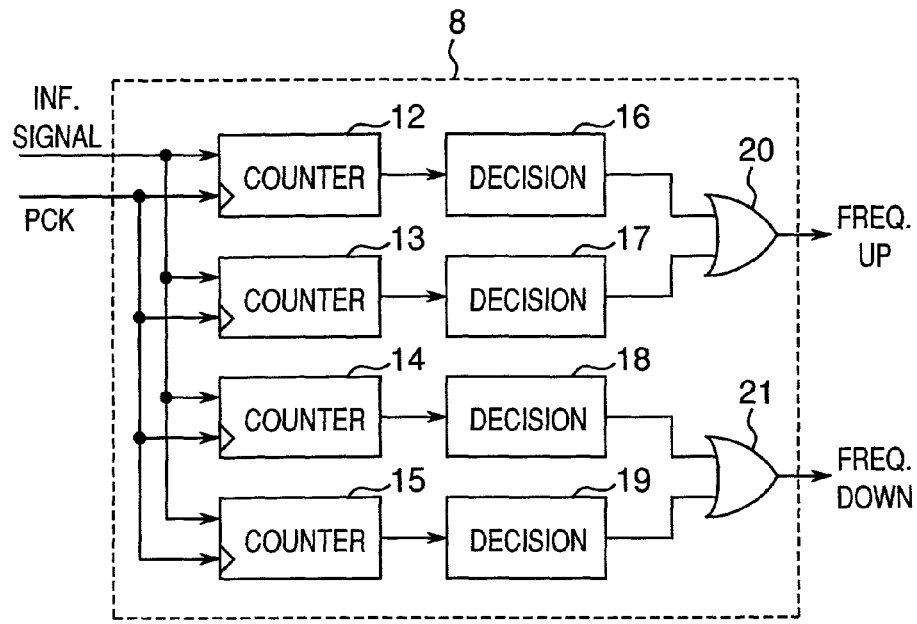
FIG. 3A is a block diagram of a frequency comparator employed in the clock extracting device of FIG. 1
Figure 3B:
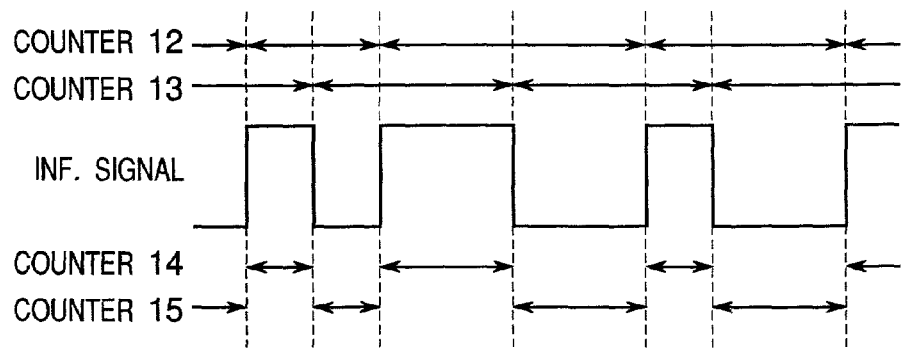
FIG. 3B is a view explanatory of operation of the frequency comparator of FIG. 3A.

The frequency comparator 8 is described in more detail with reference to FIGS. 3A and 3B. In FIG. 3A, the information signals are inputted to a first counter 12, a second counter 13, a third counter 14 and a fourth counter 15. The output PCK of the voltage control oscillator 5 is inputted to a clock terminal of each of the first to fourth counters 12 to 15. As shown in FIG. 3B explanatory of operation of the frequency comparator 8, the first counter 12 counts and outputs the number of clocks of the output PCK of the voltage control oscillator 5 during an interval from a rise edge of the information signals to the next rise edge of the information signals. The second counter 13 counts and outputs the number of clocks of the output PCK of the voltage control oscillator 5 during an interval from a fall edge of the information signals to the next fall edge of the information signals. The third counter 14 counts and outputs the number of clocks of the output PCK of the voltage control oscillator 5 during an interval from a rise edge of the information signals to the next fall edge of the information signals. The fourth counter 15 counts and outputs the number of clocks of the output PCK of the voltage control oscillator 5 during an interval from a fall edge of the information signals to the next rise edge of the information signals.

In the case of eight to fourteen modulation (EFM) signals defined in a compact disc (CD) or a mini disc (MD), an edge interval of the EFM signals ranges from 3T to 11T on the supposition that "T" denotes a unit period of the EFM signals. Thus, if an output value of the first counter 12 or the second counter 13 is not more than 5, a first decision unit 16 or a second decision unit 17 outputs a high level signal. Meanwhile, if an output value of the third counter 14 or the fourth counter 15 is not less than 12, a third decision unit 18 or a fourth decision unit 19 outputs a high level signal. In response to the high level signal from the first decision unit 16 or the second decision unit 17, an OR circuit 20 outputs a frequency UP signal. In response to the high level signal from the third decision unit 18 or the fourth decision unit 19, an OR circuit 21 outputs a frequency DOWN signal.

Figure 4:
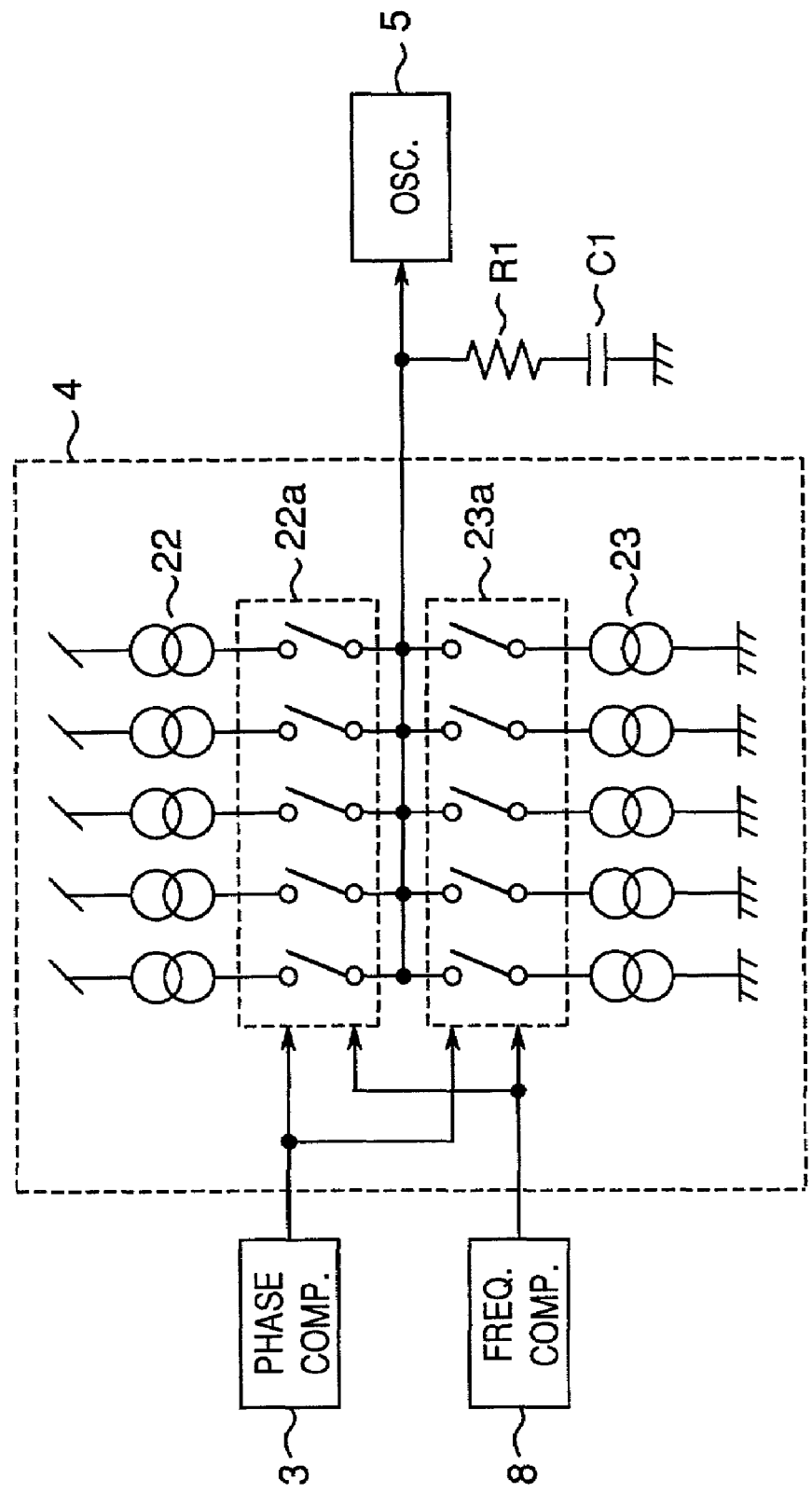
FIG. 4 is a block diagram of a charge pump employed in the clock extracting device of FIG. 1.

The charge pump 4 is of a push-pull type in which the charge pump 4 discharges or draws electric current in accordance with outputs of the phase comparator 3 and the frequency comparator 8. Furthermore, the charge pump 4 effects changeover of an output current value in accordance with an output of the gain command unit 7. The charge pump 4 is described in more detail with reference to FIG. 4. In FIG. 4, a plurality of UP charge pumps 22 for raising a frequency of an input signal and a plurality of DOWN charge pumps 23 for lowering the frequency of the input signal are connected to an input of the voltage control oscillator 5 through a plurality of switches 22a and a plurality of switches 23a, respectively. Outputs of the phase comparator 3 and the frequency comparator 8 are connected to the switches 22a and 23a so as to control the switches 22a and 23a. In this embodiment, read rate of the information signals of the optical disc 1 is set at an interval of, for example, 3 dB so as to include five sets of 0.7-time speed, 1-time speed, 1.4-time speed, 2-time speed and 2.8-time speed. Thus, five sets of the UP charge pumps 22 and the DOWN charge pumps 23 are provided for the above five read rates, respectively. One of the five sets of the UP charge pumps 22 and the DOWN charge pumps 23 are selected in accordance with the read rate by the gain command unit 7. The switch 22a or 23a of the selected set of the UP charge pump 22 and the DOWN charge pump 23 is driven by the outputs of the phase comparator 3 and the frequency comparator 8.

Since the phase comparator 3 compares the phase of the information signals outputted from the optical pickup 2 and the phase of the output PCK of the voltage control oscillator 5, an output of the phase comparator 3 is obtained when the phases of the information signals and the output PCK are close to each other even if the frequencies of the information signals and the output PCK are widely different from each other. Hence, frequency pulling is initially performed by the frequency comparator 8 until the frequencies of the information signals and the output PCK come close to each other and then, fine adjustments are made by the phase comparator 3.

Therefore, in order to give priority to the frequency comparator 8 over the phase comparator 3 when both the frequency comparator 8 and the phase comparator 3 are being operated concurrently, pulse width is increased such that once the frequency UP signal or the frequency DOWN signal has been outputted by the frequency comparator 8, the switch 22a or 23a of the charge pump 4 is held in ON state for a longer time than the phase comparator 3. Meanwhile, since a synchronous signal can be detected from the information signals in case a phase locked loop (PLL) is locked by satisfactory clock extraction, excessive operation of the frequency comparator 8 due to dropout, etc. can be prevented by gating the output of the frequency comparator 8 by this detection signal.

In this embodiment, five sets of the UP charge pumps 22 and the DOWN charge pumps 23 are provided for the five read rates but the number of the charge pumps 22 and 23 can be reduced if charge pumps having different current values are used in combination. An output current of the charge pump 4 is converted into a voltage by the series circuit of the resistor R1 and the capacitor C1, whose one end is connected to the output of the charge pump 4 and the other end of which is grounded or is connected to a reference voltage. The voltage control oscillator 5 changes its output frequency by using the output of the series circuit of the resistor R1 and the capacitor C1 as the control voltage. The speed sensor 6 detects the output frequency of the voltage control oscillator 5 and outputs a speed signal.

Figure 5:
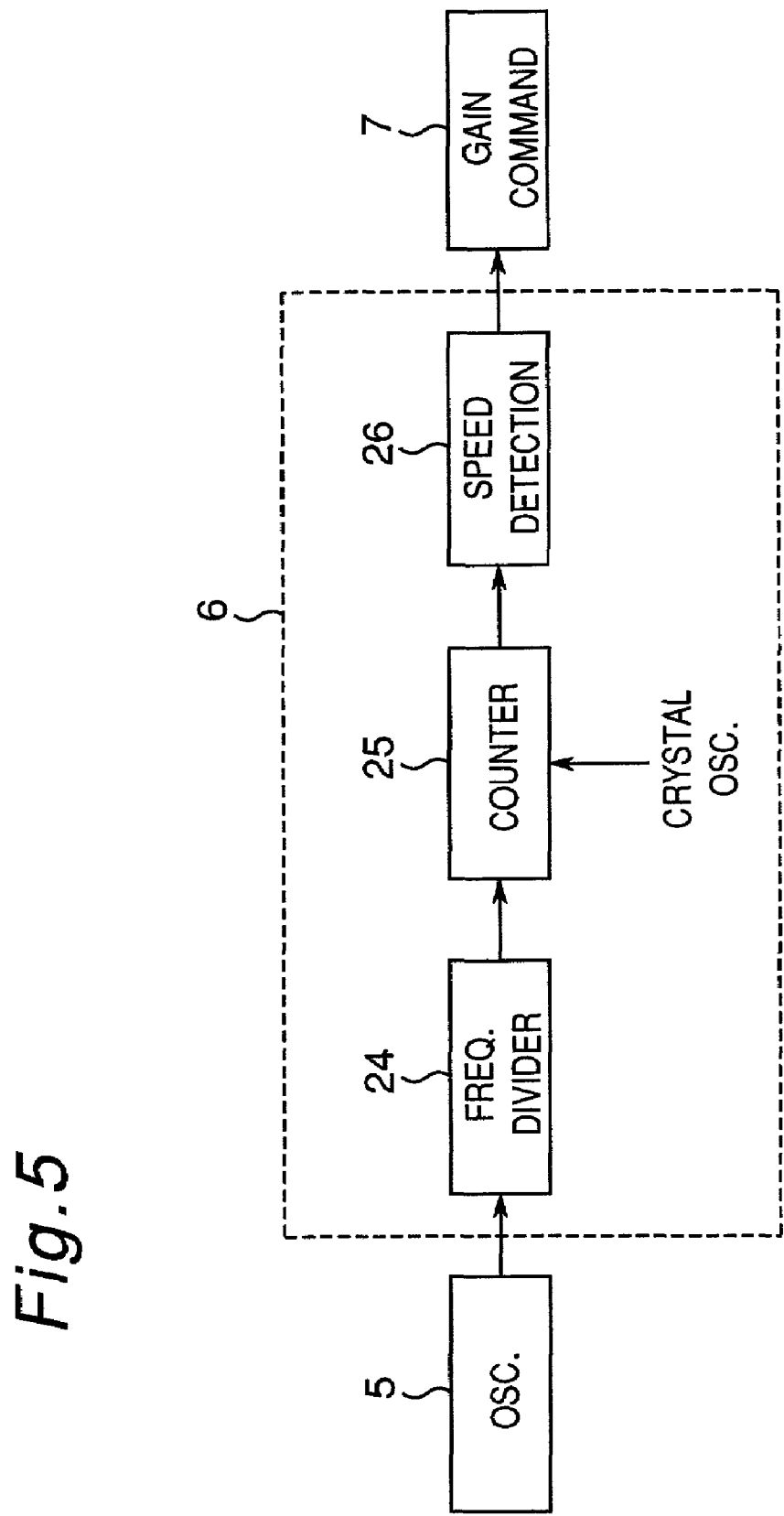
FIG. 5 is a block diagram of a speed sensor employed in the clock extracting device of FIG. 1.
Figure 6:
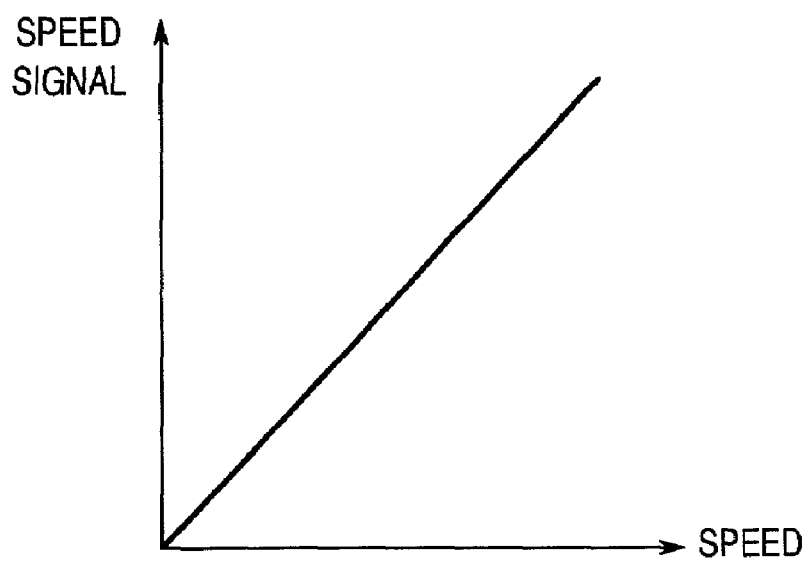
FIG. 6 is a graph showing a relation between speed and speed signal in the speed sensor of FIG. 5.

The speed sensor 6 is described in more detail with reference to FIG. 5. In FIG. 5, the output of the voltage control oscillator 5 is applied to a frequency divider 24 and an output of the frequency divider 24 is inputted to a counter 25 controlled by a crystal oscillator so as to be counted. A count result of the counter 25 is detected by a speed detection unit 26. Initially, the output from the voltage control oscillator 5, which has an oscillation frequency of, for example, 4.3218 MHz, is subjected to frequency division to (1/16) by the frequency divider 24. Each time the counter 25 detects a pulse subjected to frequency division by using as a clock the crystal oscillator having an oscillation frequency of 16.9344 MHz, the counter 25 performs a counting operation so as to output the speed signal by the count. Since counts "91", "64", "45", "32" and "22" correspond to 0.7-time speed, 1-time speed, 1.4-time speed, 2-time speed and 2.8-time speed, respectively, the speed detection unit 26 outputs the corresponding speed signal. At this time, the speed signal is proportional to the speed as shown in FIG. 6 and the speed signal changes substantially continuously in accordance with the continuously changing speed. In response to this speed signal from the speed sensor 6, the gain command unit 7 generates a range signal having a predetermined reference value of the speed signal as its boundary and issues a gain command such that a loop gain of a clock extracting circuit secures a desired operating point in accordance with the range signal.

The clock extracting device K1 of the optical disc reproducing apparatus, which has the above mentioned arrangement, is operated as follows. Initially, the necessary loop gain of the clock generating circuit changes according to read rate of the information signals of the optical disc 1 as described above. This read rate of the information signals is detected by the speed detection unit 26 as described above and changeover of the loop gain of the clock extracting circuit is performed in accordance with the speed by the gain command unit 7.

Figure 7:
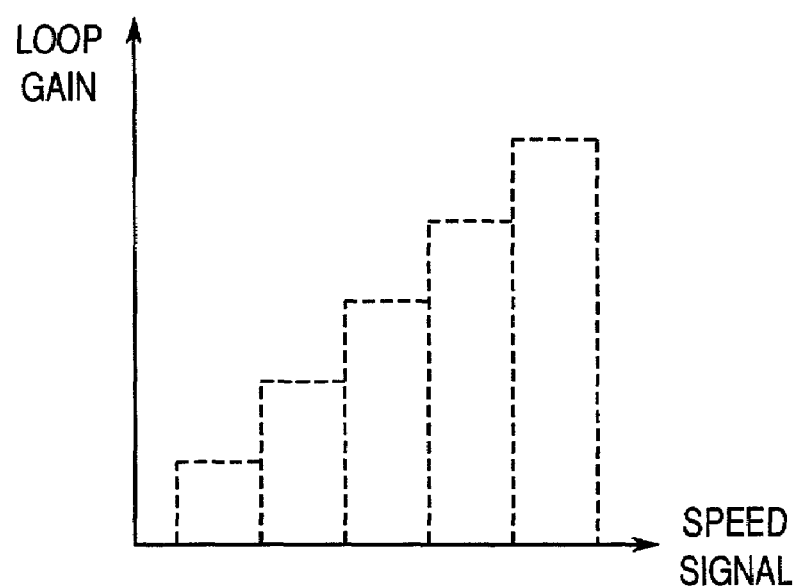
FIG. 7 is a graph showing a relation between speed signal of the speed sensor of FIG. 5 and loop gain of the clock extracting device of FIG. 1.

Then, a changeover method of the loop gain of the clock extracting circuit is described with reference to FIG. 7 showing a relation between the speed signal and the loop gain of the clock extracting circuit in this embodiment. The speed sensor 6 outputs the speed signal as described above. Since this speed signal changes continuously in accordance with the speed but the loop gain of the clock extracting circuit is changed over by five sets of the charge pumps 22 and 23, the loop gain of the clock extracting circuit changes stepwise at the predetermined reference values of the speed signal. Thus, when the speed signal assumes values close to the predetermined reference values for changing over the loop gain of the clock extracting circuit, changeover of the loop gain of the clock extracting circuit is performed frequently upon minor change of the speed signal, thereby resulting in an unstable operation of the clock extracting circuit.

Figure 8A:
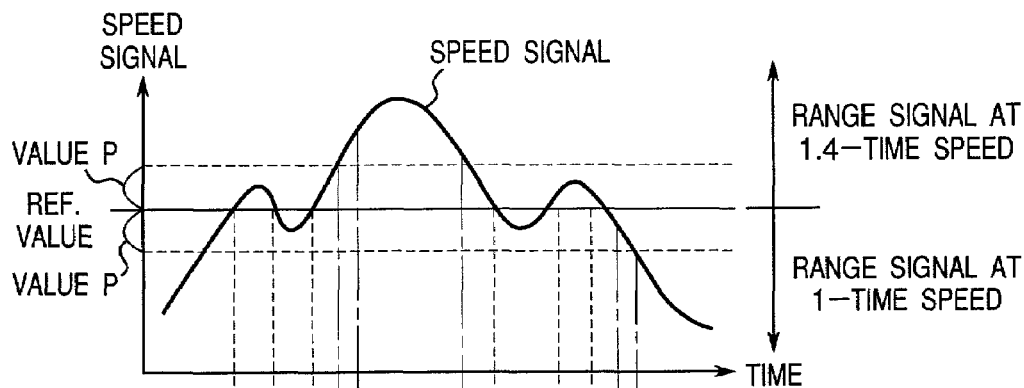
FIGS. 8A, 8B, 8C and 8D are diagrams explanatory of change of gain command on the basis of the speed signal of the speed sensor of FIG. 5.

A solution to this problem is described with reference to FIGS. 8A to 8D explanatory of change of the gain command on the basis of the speed signal in this embodiment. As one example, operation at a boundary between 1-time speed and 1.4-time speed is described. In FIG. 8A, the speed signal outputted by the speed sensor 6 changes with time and proceeds above and below a predetermined reference value. At this time, the gain command is issued at all times in accordance with a range signal indicating in which one of a speed range of 1-time speed and a speed range of 1.4-time speed bounded by the predetermined reference value the speed signal falls and changes upon change of the speed signal with time. A predetermined value P is provided above and below the predetermined reference value as a threshold value. It is decided whether or not the speed signal changes beyond the predetermined value P after the range signal has changed at the predetermined reference value. The decision may be made further in association with a predetermined period Q. In FIG. 8A, the threshold values provided above and below the predetermined reference value have the identical predetermined value P but may be different from each other.

Figure 8B:
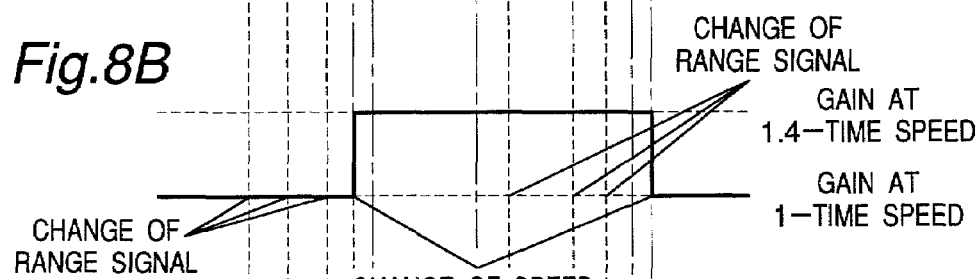

In a first solution method illustrated in FIG. 8B, in case a difference between the speed signal and the predetermined reference value is not more than the predetermined value P even if the range signal has changed at the predetermined reference value, the gain command unit 7 does not change the gain command and the loop gain of the clock extracting circuit is changed over by using a Schmitt circuit (not shown).

Figure 8C:
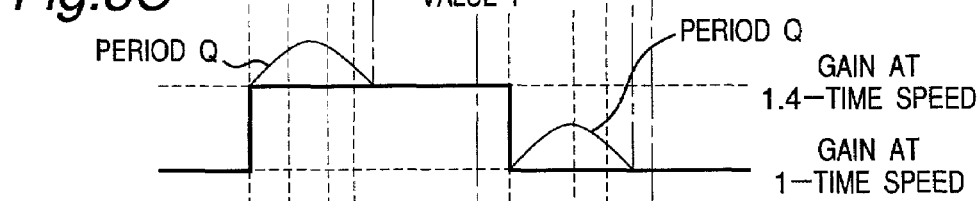

Meanwhile, in a second solution method illustrated in FIG. 8C, even if the range signal changes, the gain command unit 7 does not change the gain command for the predetermined period Q after the gain command has changed at the predetermined reference value upon change of the range signal and the loop gain of the clock extracting circuit is changed over by using a timer.

Figure 8D:
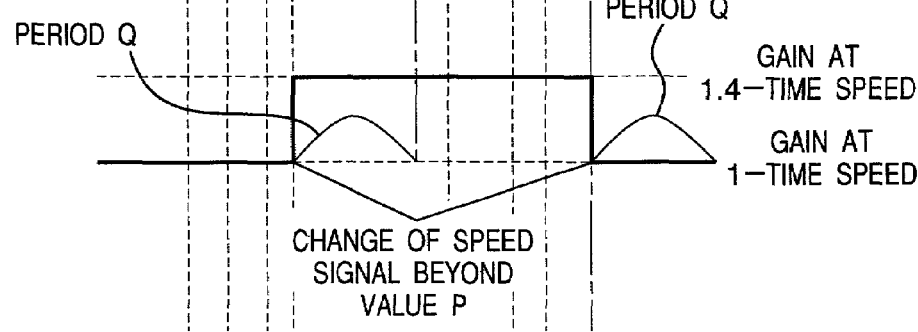

Moreover, in a third solution method illustrated in FIG. 8D, the gain command is changed upon change of the speed signal beyond the predetermined value P after the range signal has changed at the predetermined reference value and the gain command is not changed for the predetermined period Q thereafter even if the range signal changes such that the loop gain of the clock extracting circuit is changed over by using both the Schmitt circuit and the timer. When the speed signal assumes a value close to the predetermined reference value as described above, the gain command is not changed each time the speed signal changes beyond the reference value from a speed range A to a neighboring speed range B, so that stable reproduction of the information signals is ensured. The point of change of the range signal may arise when the speed signal changes from a small value to a large value or vice versa as shown in FIG. 8A.

In the clock extracting circuit for extracting the clock synchronous in phase with the information signals read from the optical disc 1 in this embodiment, when the information signals are reproduced at the extracted clock, read rate of the information signals is detected by the speed sensor 6 and the output current of the charge pump 4 is changed over by designating the loop gain of the clock extracting circuit in accordance with the speed by the gain command unit 7, so that the loop gain of the clock extracting circuit can be changed over automatically.

In addition, when (1) the gain command is changed upon change of the speed signal beyond the predetermined value P after the range signal has changed at the predetermined reference value, (2) the gain command is not changed during the predetermined period Q after the gain command has been changed or (3) the gain command is changed by combining the above methods (1) and (2), it is possible to prevent unstable operation of the clock extracting circuit due to repetition of changeover of the loop gain of the clock extracting circuit.

SECOND EMBODIMENT

Figure 9:
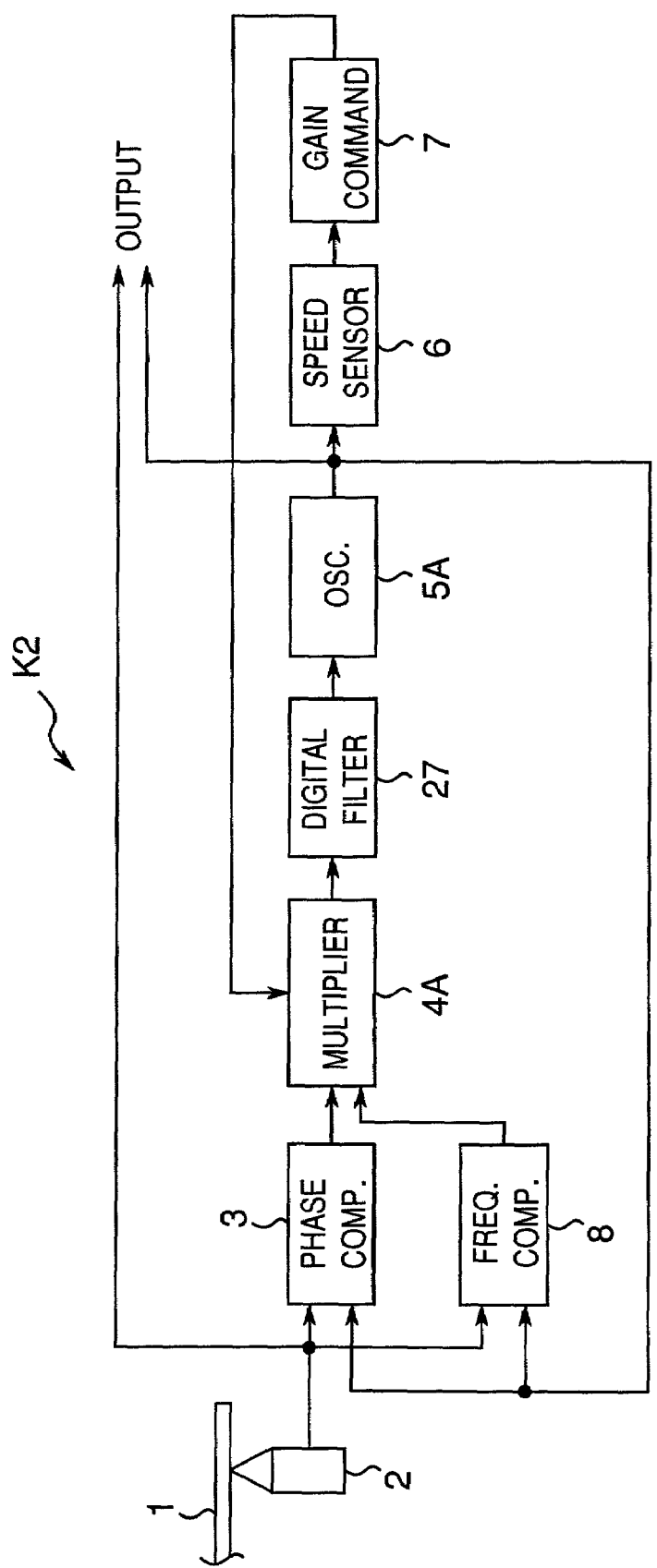
FIG. 9 is a block diagram of a clock extracting device of an optical disc reproducing apparatus, according to a second embodiment of the present invention.

FIG. 9 shows a clock extracting device K2 of an optical disc reproducing apparatus, according to a second embodiment of the present invention. In the first embodiment of FIG. 1, the clock extracting device K1 including the charge pump 4, the voltage control oscillator 5, the resistor R1 and the capacitor C1 is of analog type. On the other hand, the clock extracting device K2 includes a multiplier 4A in place of the charge pump 4, a digital filter 27 in place of the resistor R1 and the capacitor C1 and a numerical control oscillator 5A in place of the voltage control oscillator 5 so as to constitute a digital phase locked loop (DPLL). Since other configurations of the clock extracting device K2 are similar to those of the clock extracting device K1, the detailed description is abbreviated for the sake of brevity.

The multiplier 4A changes a multiplication factor in accordance with the command of the gain command unit 7. For example, when the multiplication factor is set to "1" at a standard speed, the multiplication factor assumes "2.0" at 2-time speed and "0.5" at 0.5-time speed so as to amplify the outputs of the phase comparator 3 and the frequency comparator 8 in proportion to the standard speed.

The digital filter 27 is formed by, for example, a lag lead filter so as to act as a low-pass filter and cuts a high frequency band of discrete inputs so as to perform a function corresponding to that of the series circuit of the resistor R1 and the capacitor C1 in FIG. 1.

Figure 10:
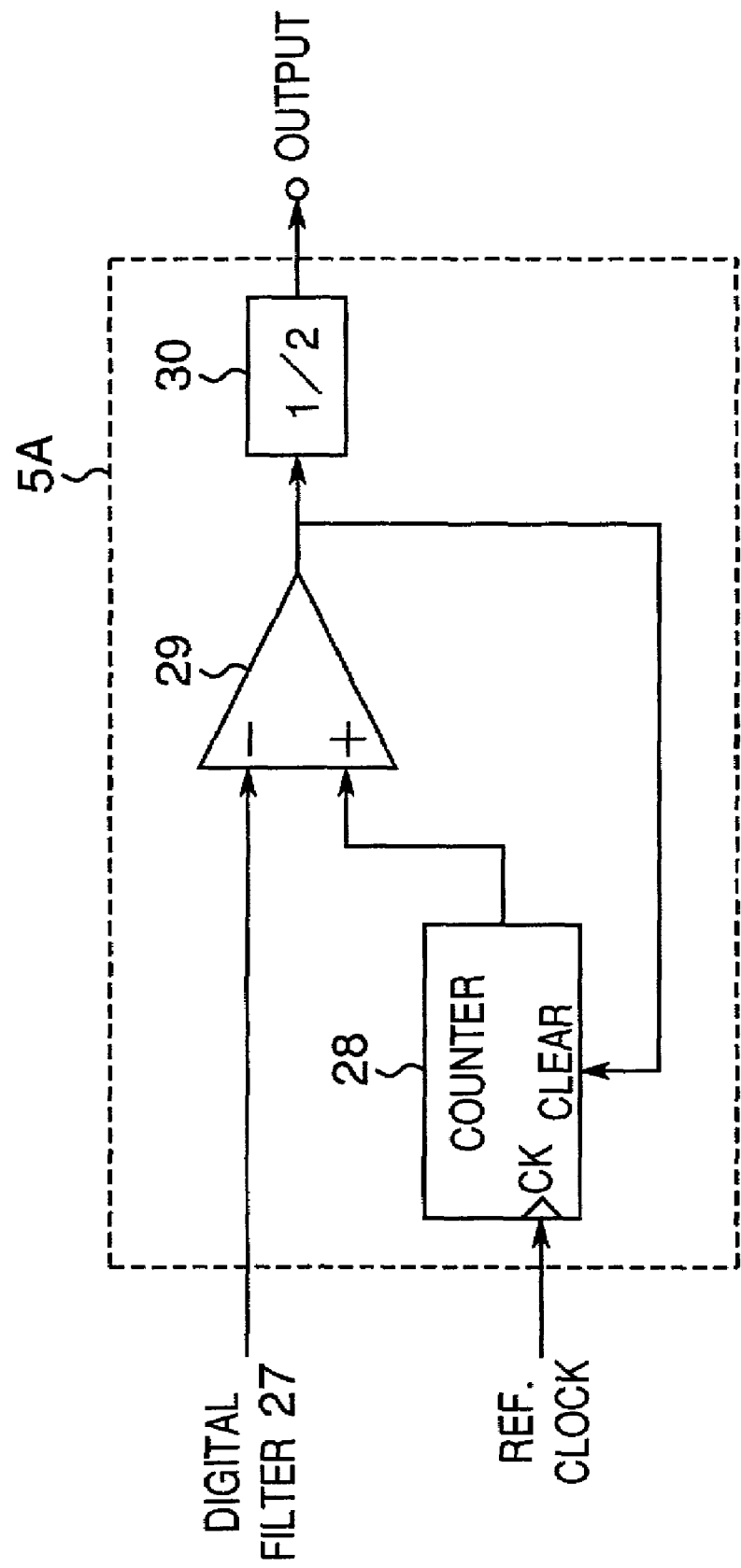
FIG. 10 is a block diagram of a numerical control oscillator employed in the clock extracting device of FIG. 9.
Figure 11:
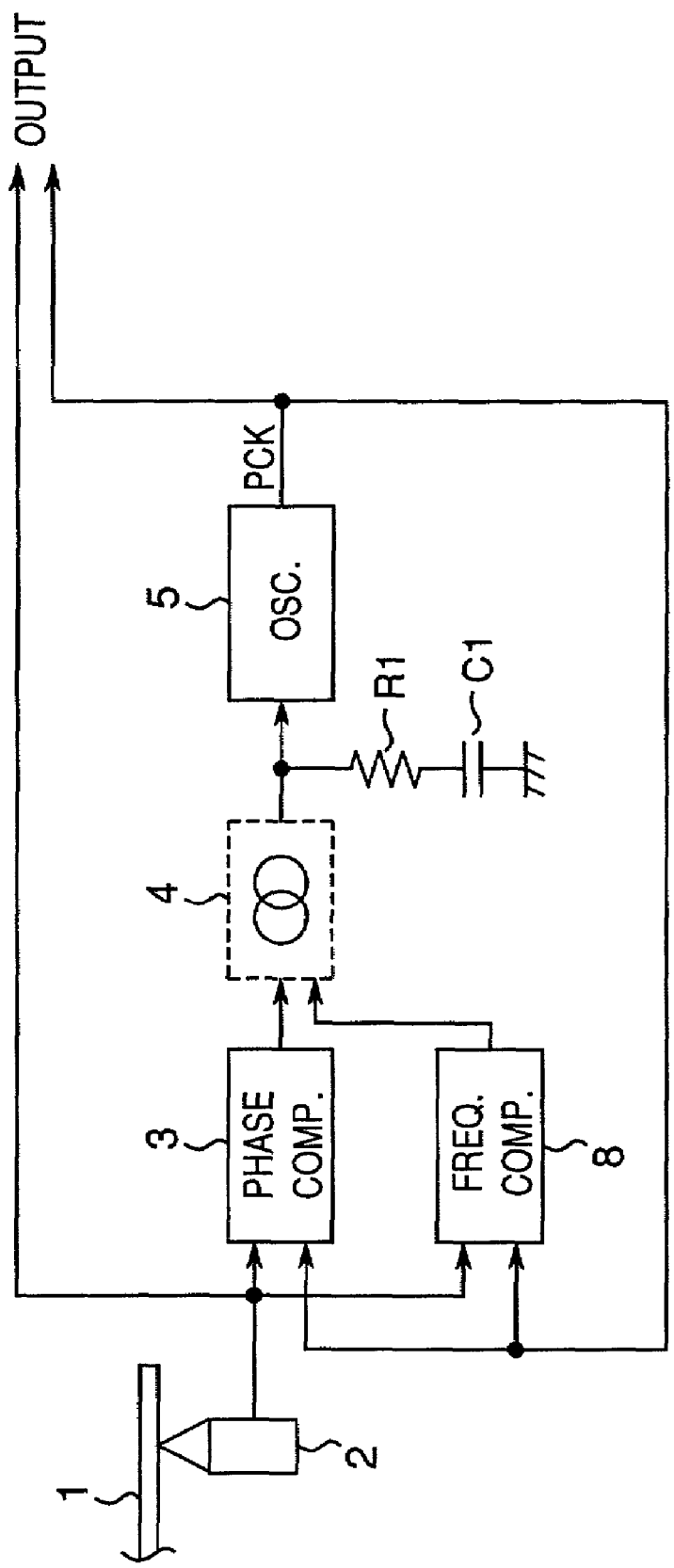
FIG. 11 is a block diagram showing a first example of a clock extracting device of a prior art optical disc reproducing apparatus.
Figure 12:
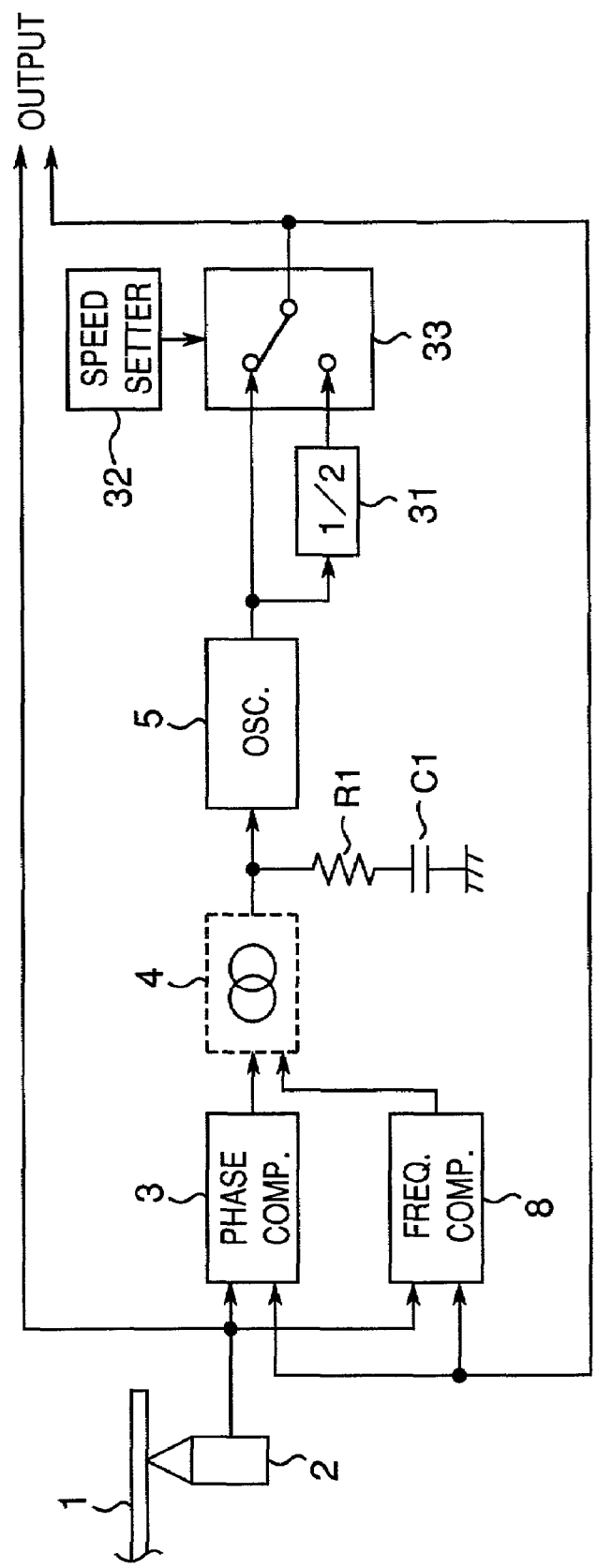
FIG. 12 is a block diagram showing a second example of the clock extracting device of the prior art optical disc reproducing apparatus.

FIG. 10 shows one example of the numerical control oscillator 5A. A reference clock is inputted to a counter 28 and an output of the counter 28 is applied to a (+) input of a magnitude comparator 29. A set input from the digital filter 27 is applied to a (−) input of the magnitude comparator 29. When the output of the counter 28 exceeds the set input from the digital filter 27, an output of the magnitude comparator 29 is obtained and the counter 28 is cleared by this output of the magnitude comparator 29. The output of the magnitude comparator 29 is subjected to, for example, (½) frequency division by a frequency divider 30 and the frequency divider 30 produces an oscillation output.

When a speed, i.e., a frequency of the information signals is higher than that of the oscillation output of the numerical control oscillator 5A, a value obtained by counting the information signals at an output clock of the numerical control oscillator 5A becomes small in the outputs of the digital frequency comparator 8 and the digital phase comparator 3, so that an input of the digital filter 27 becomes small. As a result, since an output of the digital filter 27 also becomes small, a set value of the numerical control oscillator 5A becomes small, so that an output clock interval of the numerical control oscillator 5A becomes small, namely, an output frequency of the numerical control oscillator 5 becomes high so as to catch up with the frequency of the information signals.

Also in case all the constituent elements are digitized as described above, operation of the clock extracting device K2 is similar to that of the clock extracting device K1 in that the multiplication factor of the multiplier 4A is changed by the command of the gain command unit 7 such that the loop gain corresponding to the speed is set. The outputs of the frequency comparator 8 and the phase comparator 3 are multiplied in accordance with the set loop gain and the digital filter 27 cuts the high frequency band so as to control the oscillation frequency of the numerical control oscillator 5A. In order to give priority to control of the frequency comparator 8 over that of the phase comparator 3 also in this case, control is performed such that frequency pulling is initially performed until the two input frequencies of the frequency comparator 8 become coincident with each other and then, the two phases are made coincident with each other by the output of the phase comparator 3 in the same manner as the first embodiment.

In this embodiment, the multiplication factor of the multiplier 4A changes continuously in comparison with the first embodiment but resolution of the speed sensor 6 is restrained by the reference clock, so that the stepwise changes of the loop gain still takes place. Therefore, also in this embodiment, the technique for restricting change of the gain command in response to change of the range signal is effective in the same manner as the first embodiment.

Meanwhile, in the first and second embodiments, details of the circuit configuration and numerical values are given by way of example and can be, needless to say, modified variously in the scope of the claims.

Furthermore, in the first and second embodiments, the optical disc subjected to CLV recording has been described by way of example. However, the present invention can be also applied to other recording methods such as constant angular velocity (CAV) recording and zone constant angular velocity (ZCAV) recording, a case in which a recording method is different from a reproduction method and not only the standard speed but other reproduction speeds.

In addition, in the first and second embodiments, the optical disc has been described as the information recording medium. However, the present invention can be also applied to other disklike information recording mediums such as a magneto-optical disc, a magnetic disc, etc. if the information recording mediums employ a control method identical with that of the present invention.

As is clear from the foregoing description of the clock extracting device of the disc reproducing apparatus, according to the present invention, such a remarkable effect is gained that since the desired operating point is secured automatically even if read rate of the information signals of the disklike information recording medium has changed greatly, stable reproduction of the information signals can be ensured from an inner periphery to an outer periphery of the information recording medium.

Meanwhile, in accordance with the present invention, since the gain command unit issues the gain command in accordance with the range signal indicating in which one of a plurality the speed ranges divided by one predetermined reference value or more the speed signal falls, the desired operating point can be secured by issuing the gain command in accordance with the speed.

Furthermore, in accordance with the present invention, since the gain command is not changed each time the speed signal changes when the speed signal assumes a value close to the predetermined reference value, stable reproduction of the information signals can be ensured.

Hence, since the disc subjected to CLV recording, for example, can be reproduced stably along its whole circumference at a constant rotation, increase and decrease of the number of revolutions of the disc are unnecessary also at the time of access, so that access time can be reduced substantially, power consumption required for raising and lowering the number of revolutions of the disc can be lessened and the motor can be made compact.

Moreover, in accordance with the present invention, such a marked effect is achieved that since read-out of the information of the disc can be performed also during a period from start of rotation of the disc after mounting of the disc on the player to reach of the desired number of revolutions by the disc, waiting time up to start of reproduction can be shortened.

What is claimed is:

1. A clock extracting device of a disc reproducing apparatus, comprising:
    an information read-out means for reading information signals from a disklike information recording medium;
    a voltage control oscillator;
    a phase comparator for comparing a phase of the information signals read by the information read-out means and a phase of an output of the voltage control oscillator;
    a frequency comparator for comparing a frequency of the information signals read by the information read-out means and a frequency of the output of the voltage control oscillator;
    a speed sensor for detecting the frequency of the output of the voltage control oscillator at a reference clock so as to output a speed signal corresponding to the detected frequency;
    a gain command unit for determining a plurality of speed ranges divided by a predetermined reference value and designating a loop gain of a clock extracting circuit in accordance with a range signal indicating in which one of the speed ranges the speed signal outputted from the speed sensor falls;
    a charge pump which discharges or draws electric current in accordance with outputs of the phase comparator and the frequency comparator and changes over an output current value in accordance with a gain command of the gain command unit; and
    a series circuit of a resistor and a capacitor, whose one end is connected to an output of the charge pump and the other end of which is grounded or is connected to a reference voltage;
    wherein an output voltage between the opposite ends of the series circuit acts as a control voltage for the voltage control oscillator and the gain command unit issues the gain command such that the loop gain of the clock extracting circuit secures a desired operating point in accordance with a read rate of the information signals;
    wherein the loop gain of the clock extracting circuit is raised when the read rate of the information signals increases; and
    wherein the loop gain of the clock extracting circuit is lowered when the read rate of the information signals decreases.

2. A clock extracting device as claimed in claim 1, wherein the gain command unit has a plurality of predetermined reference values.

3. A clock extracting device as claimed in claim 2, wherein even if the range signal changes upon change of the speed signal from one of the speed ranges to a neighboring one of the speed ranges, the gain command unit does not change the gain command when a difference between the speed signal and the predetermined reference value for dividing the one and the neighboring one of the speed ranges is not more than a predetermined value.

4. A clock extracting device as claimed in claim 3, wherein even if the range signal changes, the gain command unit does not change the gain command during a predetermined period after the gain command has been changed.

5. A clock extracting device as claimed in claim 2, wherein even if the range signal changes, the gain command unit does not change the gain command during a predetermined period after the gain command has been changed.

6. A clock extracting device of a disc reproducing apparatus, comprising:
    an information read-out means for reading information signals from a disklike information recording medium;
    a numerical control oscillator;
    a phase comparator for comparing a phase of the information signals read by the information read-out means and a phase of an output of the numerical control oscillator;
    a frequency comparator for comparing a frequency of the information signals read by the information read-out means and a frequency of the output of the numerical control oscillator;

a speed sensor for detecting the frequency of the output of the numerical control oscillator at a reference clock so as to output a speed signal corresponding to the detected frequency;

a gain command unit for determining a plurality of speed ranges divided by a predetermined reference value and designating a loop gain of a clock extracting circuit in accordance with a range signal indicating in which one of the speed ranges the speed signal outputted from the speed sensor falls;

a multiplier for changing a multiplication factor in accordance with a gain command of the gain command unit so as to amplify outputs of the phase comparator and the frequency comparator; and a digital filter for amplifying a low frequency band of an output of the multiplier;

wherein an output of the digital filter acts as a control input for the numerical control oscillator and the gain command unit issues the gain command such that the loop gain of the clock extracting circuit secures a desired operating point in accordance with a read rate of the information signals;

wherein the loop gain of the clock extracting circuit is raised when the read rate of the information signals increases; and wherein the loop gain of the clock extracting circuit is lowered when the read rate of the information signals decreases.

7. A clock extracting device as claimed in claim 6, wherein the gain command unit has a plurality of predetermined reference values.

8. A clock extracting device as claimed in claim 7, wherein even if the range signal changes upon change of the speed signal from one of the speed ranges to a neighboring one of the speed ranges, the gain command unit does not change the gain command when a difference between the speed signal and the predetermined reference value for dividing the one and the neighboring one of the speed ranges is not more than a predetermined value.

9. A clock extracting device as claimed in claim 8, wherein even if the range signal changes, the gain command unit does not change the gain command during a predetermined period after the gain command has been changed.

10. A clock extracting device as claimed in claim 7, wherein even if the range signal changes, the gain command unit does not change the gain command during a predetermined period after the gain command has been changed.

* * * * *